United States Patent
Dauksher et al.

(12)

(10) Patent No.: US 6,368,752 B1
(45) Date of Patent: Apr. 9, 2002

(54) LOW STRESS HARD MASK FORMATION METHOD DURING REFRACTORY RADIATION MASK FABRICATION

(75) Inventors: William J. Dauksher, Mesa; Douglas J. Resnick, Phoenix, both of AZ (US)

(73) Assignee: Motorola, Inc., Schaumburg, IL (US)

( * ) Notice: Subject to any disclaimer, the term of this patent is extended or adjusted under 35 U.S.C. 154(b) by 701 days.

(21) Appl. No.: 08/740,402

(22) Filed: Oct. 29, 1996

(51) Int. Cl.[7] ............................................... G03F 9/00
(52) U.S. Cl. .......................................................... 430/5
(58) Field of Search ............................................. 430/5

(56) References Cited

U.S. PATENT DOCUMENTS

| | | | | |
|---|---|---|---|---|
| 4,037,111 A | * | 7/1977 | Coquin et al. ............... | 250/505 |
| 4,374,912 A | * | 2/1983 | Kaneki et al. ................. | 430/5 |
| 4,440,841 A | * | 4/1984 | Tabuchi ......................... | 430/5 |
| 4,448,865 A | * | 5/1984 | Bohlen et al. ................. | 430/5 |
| 4,522,842 A | * | 6/1985 | Levinstein et al. ............ | 427/8 |
| 5,005,075 A | * | 4/1991 | Kobayashi et al. ........... | 378/35 |
| 5,188,706 A | * | 2/1993 | Hori et al. ..................... | 156/643 |
| 5,580,687 A | * | 12/1996 | Leedy ............................. | 430/5 |

* cited by examiner

*Primary Examiner*—Nam Nguyen
*Assistant Examiner*—S. H. Ver Steeg
(74) *Attorney, Agent, or Firm*—George R. Meyer; Robert A. Rodriguez

(57) ABSTRACT

A method of forming a hard mask for use in the formation of a refractory radiation mask including providing a membrane structure, forming a radiation absorbing layer to be patterned on the membrane structure, forming a hard mask layer on the surface of the membrane structure, the hard mask layer including a material system having a nominally zero stress and therefore reduced distortion of the membrane structure, and patterning the hard mask layer.

10 Claims, 1 Drawing Sheet

LOW STRESS HARD MASK FORMATION METHOD DURING REFRACTORY RADIATION MASK FABRICATION

FIELD OF THE INVENTION

This invention pertains to refractory radiation mask fabrication and more specifically to methods of forming a hard mask having less stress during the fabrication of refractory radiation masks.

BACKGROUND OF THE INVENTION

Generally, for convenience and because standard semiconductor tools can be used in the fabrication process, refractory radiation masks are formed on a semiconductor wafer, such as a silicon wafer. The silicon wafer operates like a frame and support for the mask. A thin layer that ultimately becomes the membrane is deposited on the upper surface of the wafer. A layer of radiation absorbing material, such as some safe heavy metal or alloy, is deposited on the upper surface of the membrane layer. The radiation absorbing layer is patterned by applying a hard mask material and resist. The resist is patterned (or exposed) with an electron beam (E-beam) device and a hard mask is formed by etching the hard mask layer through the patterned resist layer. The hard mask is then used as an etch mask to pattern the radiation absorbing layer. At some point in the process the wafer is etched from the membrane layer in a circle or a rectangle to form a thin membrane. The mask thus allows radiation to pass through the thin membrane and portions of the radiation absorbing layer that have been etched away. The entire procedure is known as a process flow and two different process flows are commonly used.

In the first process flow, commonly referred to as a wafer flow, all processing is done on the wafer with one of the final steps being the back etching of the silicon wafer to form the membrane. The wafer flow was primarily created to solve formatting issues. It allows refractory radiation mask processing to be conducted in semiconductor tools that are not dramatically different from the standard wafer processing tools supplied by the industry. The refractory radiation mask specific processing steps (membrane formation and wafer mounting to a support ring) are at the end of the flow. This minimizes the modifications necessary to both the tools and the wafer processes. However, the creation of the membrane and the mounting of the wafer creates significant pattern displacement errors (~0.15 $\mu$m) in the mask.

The second process flow is commonly referred to as a membrane flow. In the membrane flow the membrane is formed early in the process (generally after hard mask deposition) and the remaining processing is carried out on the membrane. The membrane flow process was derived to remove the errors in the wafer flow process by conducting the mask specific processing steps before the absorber layer is patterned. While this greatly reduces the errors associated with membrane formation and wafer mounting, it also increases the modifications to both the equipment (the tools must accept a refractory radiation mask format rather than a wafer) and the processes (the patterning defining process steps are carried out on a membrane rather than a wafer).

The major problem encountered in the formation of a refractory radiation mask is that the membrane is not a rigid structure. Stress or stress gradients present in the layers being patterned will result in distortion of the mask. It has been found that stress gradients have more impact on image placement than does a uniform stress. Conventionally, chromium (Cr) is used as a hard mask material. However, the ability to repeatably and controllably deposit Cr at zero stress has not been demonstrated. Another widely used hard mask material is silicon dioxide ($SiO_2$). $SiO_2$, which for refractory radiation mask applications is typically deposited in a PECVD system, usually suffers from a high compressive stress.

It is a purpose of the present invention to provide new and improved methods of fabricating refractory radiation masks.

It is another purpose of the present invention to provide new and improved methods of fabricating refractory radiation masks which have less distortion during pattern writing so as to greatly improve the accuracy.

It is a further purpose of the present invention to provide new and improved methods of fabricating refractory radiation masks including the use of a new hard mask fabrication method which substantially reduces distortion during fabrication of the refractory radiation mask.

SUMMARY OF THE INVENTION

Briefly, to achieve the desired objects of the instant invention in accordance with a preferred embodiment thereof, provided is a method of forming a hard mask for use in the formation of a refractory radiation mask including providing a membrane structure, forming a radiation absorbing layer to be patterned on the membrane structure, forming a hard mask layer on the surface of the membrane structure, the hard mask layer including a material system having reduced stress and therefore reduced distortion of the membrane structure, and patterning the hard mask layer.

In a further embodiment, the step of forming the hard mask includes forming the material system that is a cross between an oxide and a nitride.

Also provided is a method of fabricating a refractory radiation mask including providing a wafer with a planar surface, forming a membrane layer on the planar surface of the wafer, forming a layer of radiation absorbing material on the membrane layer, forming a hard mask on the layer of radiation absorbing material, the hard mask including a material system having nominally zero stress and therefore reduced distortion of the membrane structure, defining a pattern on the layer of radiation absorbing material, and forming the pattern through the layer of radiation absorbing material to form a refractory radiation mask.

In another embodiment, the hard mask includes a material system having a first material under compressive stress and a second material under tensile stress the stresses of the first material and the second material substantially offset to reduce stress in the hard mask layer.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawing, in which.

DESCRIPTION OF THE PREFERRED EMBODIMENT

Figure 1:
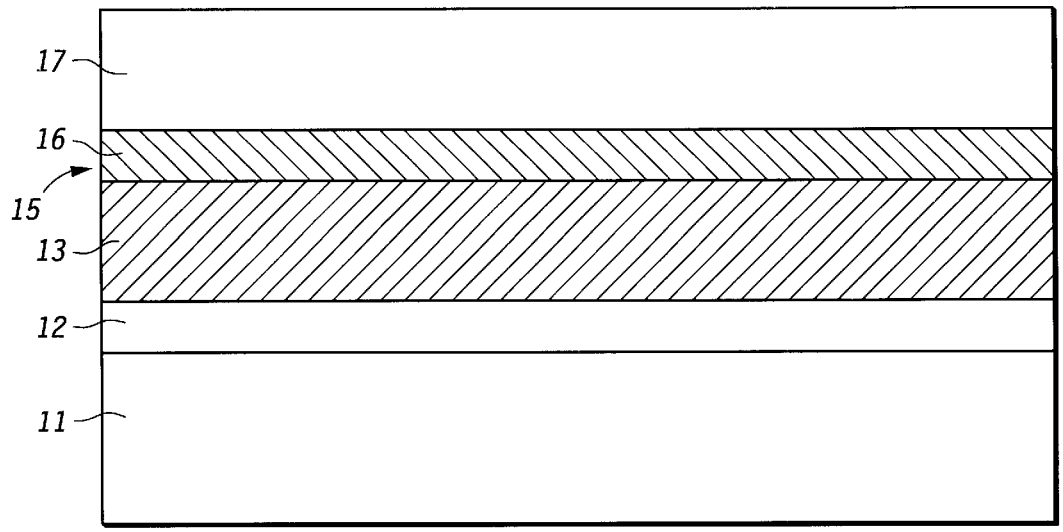
FIGS. 1 and 2 are simplified sectional views of steps in a process of forming a refractory radiation mask in accordance with the present invention.

Turning now to the drawings in which like reference characters indicate corresponding elements throughout the several views, attention is first directed to FIG. 1 which illustrates various layers used in the fabrication of a refractory radiation mask 10 in accordance with the present invention. In this disclosure the radiation used for exemplary purposes is X-rays but it could also include light, electrons, ions, or other charged particles. Mask 10 includes a supporting member 11 which is referred to herein as a "wafer". For convenience and because semiconductor tools and equipment are generally utilized in the fabrication and use processes, the supporting member will be a semiconductor wafer, such as a silicon wafer. Also, the wafer commonly used by today'manufacturers is a silicon wafer 100 mm in diameter and 2.1 mm thick. However, it should be understood that other members, materials, and sizes might be utilized and the term "wafer" is intended to encompass all such members.

A membrane layer 12 is formed on a planar upper surface of the supporting member by any convenient method, including epitaxial growth, deposition, etc. Generally, membrane layer 12 is formed of some convenient material, such as doped silicon (Si), silicon nitride (SiN), or silicon carbide (SiC) as used in this specific example. Also, when membrane layer 12 is formed on supporting member 11 it is typically formed in tension. The material used for membrane layer 12 does not have a significant effect on the resulting distortions. As is understood by those skilled in the art, it is only necessary that membrane layer 12 be of a material and thickness such that it is transparent to radiation such as X-rays during use of the mask.

While the present method discloses the fabrication of X-ray masks, it should be understood that other types of masks (e.g. ion masks, electron masks, etc.) might be fabricated by the same process and it is intended that the terms "mask" and "membrane structure" will include all such variations. Further, while a specific membrane structure has been utilized for purposes of this disclosure, it should be understood that the term membrane structure is intended to encompass all membranes or free standing layers which will be effected by the hard mask formation procedures disclosed herein. Also, it will be understood by those skilled in the art that the aforementioned X-ray process flow is generic and the intent of the patent is to encompass minor perturbations to the process flow. For example, a thin anti-reflective coating or etch stop may be interposed between the membrane material and the absorber without changing the spirit of this disclosure.

A radiation absorbing material is deposited on the surface of membrane layer 12 as a radiation absorbing layer 13. Generally, the radiation absorbing material may be any convenient material which will absorb radiation passing through membrane layer 12 so as to prevent the radiation from passing on through layer 13. Materials such as tantalum (Ta), tantalum-silicon nitride (TaSiN), tantalum-silicon (TaSi), tantalum-boride (Ta4B), heavy metals, etc. are commonly used when the radiation is X-rays as in this example. In this specific embodiment, tantalum-silicon nitride (TaSiN) or tantalum-silicon (TaSi) is employed.

Figure 2:
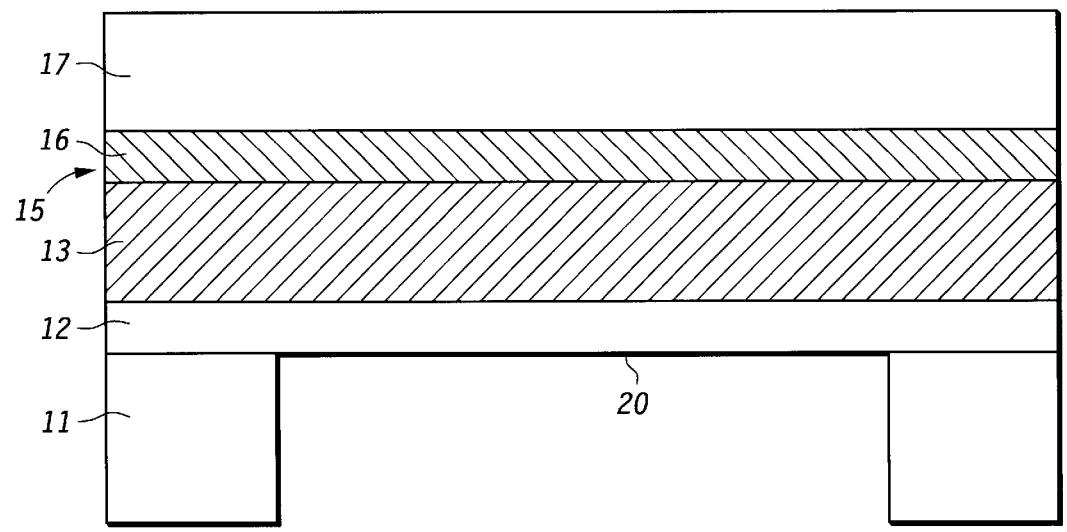

Referring to FIG. 2, a portion of wafer 11 is removed exposing a portion of the lower surface, or membrane area 20, of membrane layer 12, thereby essentially forming membrane layer 12 into a membrane. Membrane area 20 may have substantially any desired configuration but in a preferred embodiment will be rectangular. Because the present fabrication technique generally applies to the membrane flow, a portion of the wafer is removed at this time, prior to the formation of a hard mask. While the present novel method is most applicable to the membrane flow, it will be understood that in some special applications it may also be applicable to the wafer flow, or to any modified types of flow.

A hard mask 15 is formed on the upper surface of layer 13 for the purpose of transferring a chosen pattern to layer 13, as will be explained in more detail below. Hard mask 15 is formed by depositing a hard mask layer 16 on layer 13 (which may be done prior to the previous step of removing a portion of the wafer) and patterning hard mask layer 16 to form hard mask 15. Patterning hard mask layer 16 includes depositing a resist layer 17 on hard mask layer 16, patterning resist layer 17 to form an etch mask, and etching hard mask layer 16.

Generally, resist layer 17 is formed of any convenient material on which can easily be written the chosen pattern, for example with an electron beam (E-beam) device or the like. After the chosen pattern is formed in resist layer 17, hard mask layer 16 is etched to transfer the pattern thereto, using resist layer 17 as a mask to form hard mask 15.

As will be understood by those skilled in the art, resist material is generally not strong enough to be used as an etch mask for etching the chosen pattern in layer 13. Thus, hard mask 15 is fabricated to form a sufficiently serviceable mask for the etching of layer 13. Hard mask 15 and resist layer 17 are removable so that once the chosen pattern has been transferred to layer 13 they can be easily removed.

Conventionally, a very thin layer of metal (e.g. chromium or $SiO_2$) is deposited to form hard mask layer 16. However, the ability to repeatably and controllably deposit chromium at very low and uniform stress has not been demonstrated. With the current low stress methods, stresses between $-2E09$ dynes/cm$^2$ and $+2E09$ dynes/cm$^2$ have been achieved. These low stress processes are often accompanied by a large stress gradient. The large stress gradient has been found to cause greater deleterious distortions on the membrane than does a high but uniform stress. $SiO_2$ suffers from a high compressive stress approximately equal to 2E09 dynes/cm$^2$. These materials and processes place stress on the membrane, distorting the image and destroying image placement.

The novelty in the present invention is the greatly reduced and uniform stress of hard mask 15. The formation of hard mask layer 16 includes depositing a material system that is a cross between an oxide under compressive stress and a nitride under tensile stress on the surface of the membrane structure, and is referred to as an oxynitride. The stress of the oxynitride in the material system offers substantially reduced stress in hard mask layer 16 and therefore reduces distortion of the membrane.

As an example of the formation of hard mask layer 16 in accordance with the present invention, layer 16 is deposited by a PECVD process in which a Plasma Therm PT 740 tool is employed with the following conditions to provide a low and uniformly stressed oxynitride hard mask layer:

| | |
|---|---|
| $NH_3$ | 10 sccm |
| N2 | 900 sccm |
| $N_2O$ | 50 sccm |
| $SiH_4$ | 250 sccm | at a temperature of 250 degrees centigrade, a pressure of 900 mT, and a power of 45 W. While these conditions have been demonstrated to satisfy the process criteria, it will be understood that other processing conditions and tools can also be used to produce a low stress oxynitride hard mask layer. A 3000 angstrom layer deposited under these conditions has been found to posses an average stress of less than 1E08 dynes/cm$^2$ with a range of stresses of + or $-1.5E08$ dynes/cm$^2$ in the membrane area.

In addition to reduced stress resulting in reduced distortion, an oxynitride material system possesses other characteristics which make it ideal as a hard mask layer. The selectivity of oxynitride to a resist (Shipley SNR200) in CHF3 is greater than 2:1, with the etch rate of the oxynitride approximately 294 angstroms/min. and the etch rate of the resist approximately 140 angstroms/min. This permits sub 0.18 micron features to be easily patterned. Furthermore, the selectivity of the absorber (TaSiN) to the oxynitride is very high, with the etch rate of the TaSiN approximately 1700 angstroms/min. and the etch rate of the oxynitride approximately 379 angstroms/min. Also, the oxynitride layers are amorphous. Studies have suggested that an amorphous hard mask layer offers reduced line edge roughness of the absorber from the pattern transfer process.

Thus, a new and improved method of fabricating refractory radiation masks has been disclosed, which method produces less distortion in the mask so as to greatly improve the accuracy. Further, the method includes the use of a new hard mask fabrication method wherein the hard mask has low and uniform stress which substantially reduces distortion during fabrication of the refractory radiation mask.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of forming a hard mask for use in the formation of a refractory radiation mask comprising the steps of:

providing a membrane structure including a step of forming a radiation absorbing layer to be patterned as a portion of the membrane structure;

forming a hard mask layer on a surface of the radiation absorbing layer of the membrane structure, the hard mask layer including a material system creating an average stress in the membrane structure of less than 1E08 dynes/cm$^2$ and a range of stresses from +1.5E08 dynes/cm$^2$ to −1.5E08 dynes/cm$^2$ and therefore reduced distortion of the membrane structure; and patterning the hard mask layer.

2. A method of forming a hard mask for use in the formation of a refractory radiation mask as claimed in claim 1 wherein the step of patterning the hard mask layer includes the steps of:

depositing a resist layer on the hard mask layer;

patterning the resist layer to form an etch mask on the hard mask layer; and etching the hard mask layer.

3. A method of forming a hard mask for use in the formation of a refractory radiation mask as claimed in claim 2 wherein the step of patterning the resist layer includes writing the pattern in the layer of resist using an electron beam device to write the pattern.

4. A method of forming a hard mask for use in the formation of a refractory radiation mask as claimed in claim 3 wherein the step of forming the hard mask includes forming the material system of an oxynitride.

5. A method of forming a hard mask for use in the formation of a refractory radiation mask as claimed in claim 4 wherein the step of forming the material system of the oxynitride includes depositing the material system in an oxynitride PECVD process.

6. A method of forming a hard mask for use in the formation of a refractory radiation mask comprising the steps of:

providing a membrane structure including a step of forming a radiation absorbing layer to be patterned as a portion of the membrane structure;

forming a hard mask layer, including oxynitride at nominally zero stress, on a surface of the radiation absorbing layer of the membrane structure, the nominally zero stress of the oxynitride in the hard mask layer providing reduced distortion of the membrane; and patterning the hard mask layer.

7. A method of forming a hard mask for use in the formation of a refractory radiation mask as claimed in claim 6 wherein the step of patterning the hard mask layer includes the steps of:

depositing a resist layer on the hard mask layer;

patterning the resist layer to form an etch mask on the hard mask layer; and etching the hard mask layer.

8. A method of forming a hard mask for use in the formation of a refractory radiation mask as claimed in claim 7 wherein the step of patterning the resist layer includes writing the pattern in the layer of resist using an electron beam device to write the pattern.

9. A method of forming a hard mask for use in the formation of a refractory radiation mask as claimed in claim 8 wherein the step of forming the hard mask layer includes depositing the oxynitride with a PECVD process.

10. A method of forming a hard mask for use in the formation of a refractory radiation mask comprising the steps of:

providing a membrane structure including a step of forming a radiation absorbing layer to be patterned as a portion of the membrane structure;

forming a hard mask layer on a surface of the radiation absorbing layer of the membrane structure, the hard mask layer including a material system having a first material under compressive stress and a second material under tensile stress with the stresses of the first material and the second material being substantially offset to uniformly reduce stress in the hard mask layer and therefore reduce distortion of the membrane structure; and patterning the hard mask layer.

* * * * *